(12) United States Patent
Darveaux et al.

(10) Patent No.: US 11,765,814 B2
(45) Date of Patent: Sep. 19, 2023

(54) DEVICES AND METHODS RELATED TO NESTED FILTERS

(71) Applicant: SKYWORKS SOLUTIONS, INC., Woburn, MA (US)

(72) Inventors: Robert Francis Darveaux, Corona Del Mar, CA (US); Ki Wook Lee, Irvine, CA (US); Takeshi Furusawa, Toyonaka (JP); Sundeep Nand Nangalia, Raleigh, NC (US); Russ Alan Reisner, Oxnard, CA (US); John C. Baldwin, Simi Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/558,056

(22) Filed: Aug. 31, 2019

(65) Prior Publication Data
US 2020/0077510 A1 Mar. 5, 2020

Related U.S. Application Data

(60) Provisional application No. 62/726,127, filed on Aug. 31, 2018.

(51) Int. Cl.
*H05K 1/02* (2006.01)
*H05K 1/18* (2006.01)
*H01Q 1/22* (2006.01)
*H05K 1/11* (2006.01)
*H04B 1/10* (2006.01)

(52) U.S. Cl.
CPC ......... *H05K 1/0243* (2013.01); *H01Q 1/2283* (2013.01); *H04B 1/10* (2013.01); *H05K 1/113* (2013.01); *H05K 1/183* (2013.01); *H05K 2201/10098* (2013.01)

(58) Field of Classification Search
CPC .......... H04B 1/10; H01Q 1/2283; H03H 7/17; H03H 7/06; H03H 7/0138; H05K 1/0243; H05K 1/113; H05K 1/183
See application file for complete search history.

(56) References Cited

U.S. PATENT DOCUMENTS

| | | | | |
|---|---|---|---|---|
| 5,182,670 A * | 1/1993 | Khan | ..................... | G02B 5/285 |
| | | | | 252/588 |
| 6,373,350 B1 * | 4/2002 | Fujita | ..................... | H04B 1/52 |
| | | | | 333/133 |
| 11,483,023 B2 * | 10/2022 | Kani | ..................... | H04B 1/40 |

(Continued)

OTHER PUBLICATIONS

International Search Report dated Jan. 15, 2020 for PCT/US2019/049242.
Written Opinion dated Jan. 15, 2020 for PCT/US2019/049242.

*Primary Examiner* — Steven S Kelley
(74) *Attorney, Agent, or Firm* — Chang & Hale LLP

(57) ABSTRACT

Devices and methods related to nested filters. In some embodiments, a radio-frequency device can include a substrate, and first and second filter devices mounted on the substrate with respective support structures, such that at least a portion of the second filter device is positioned in a space defined by an underside of the first filter device and the support structures for the first filter device. Such a radio-frequency device can be, for example, a packaged module for use in an electronic device such as a wireless device.

5 Claims, 14 Drawing Sheets

(56) References Cited

U.S. PATENT DOCUMENTS

| | | | |
|---|---|---|---|
| 2003/0169575 A1* | 9/2003 | Ikuta | H01L 23/5389 |
| | | | 361/761 |
| 2012/0049978 A1 | 3/2012 | Wei et al. | |
| 2015/0137910 A1* | 5/2015 | Chen | H03H 7/06 |
| | | | 333/172 |
| 2015/0348865 A1 | 12/2015 | Vincent et al. | |
| 2017/0012603 A1 | 1/2017 | Reisner et al. | |
| 2017/0179920 A1 | 6/2017 | Kawasaki | |
| 2017/0303400 A1 | 10/2017 | Frenette et al. | |
| 2018/0375202 A1* | 12/2018 | Li | H01Q 9/0407 |
| 2019/0343000 A1* | 11/2019 | Frenette | H01L 23/3107 |
| 2019/0378801 A1* | 12/2019 | Leitgeb | H01L 23/552 |
| 2022/0189864 A1* | 6/2022 | Yazdani | H01L 23/04 |
| 2022/0320712 A1* | 10/2022 | Lu | H01P 1/20381 |

* cited by examiner

DEVICES AND METHODS RELATED TO NESTED FILTERS

CROSS-REFERENCE TO RELATED APPLICATION(S)

This application claims priority to U.S. Provisional Application No. 62/726,127 filed Aug. 31, 2018, entitled DEVICES AND METHODS RELATED TO NESTED FILTERS, the disclosure of which is hereby expressly incorporated by reference herein in its respective entirety.

BACKGROUND

Field

The present disclosure relates to devices and methods related to nested filters for radio-frequency applications.

Description of the Related Art

In radio-frequency applications, filters are utilized to condition signals such as signals to be transmitted and/or received signals. Such filters can include, for example, low-pass filters, high-pass filters and/or band-pass filters.

SUMMARY

In some implementations, the present disclosure relates to a radio-frequency device that includes a substrate and first and second filter devices mounted on the substrate with respective support structures, such that at least a portion of the second filter device is positioned in a space defined by an underside of the first filter device and the support structures for the first filter device.

In some embodiments, the substrate can include multiple layers having a first layer at an upper side of the substrate and a second layer underneath the first layer. In some embodiments, each of the first and second filter devices can be mounted on the first layer. In some embodiments, the substrate can include a cavity defined by at least the first layer and include a floor, such that the second filter device is mounted on the floor of the cavity. The cavity can have a depth that is approximately the same as a thickness of the first layer, such that an upper surface of the second layer is or close to the floor of the cavity. The first filter device can be mounted on an upper surface of the first layer.

In some embodiments, each of the support structures for the first filter device can be dimensioned to provide sufficient height in the space to accommodate the second filter device. Each of the support structures for the first filter device can include a metal structure and a solder structure, with the metal structure having a melting point higher than that of the solder structure to prevent collapse of the first filter device onto the second filter device if the solder structure fails. In some embodiments, the metal structure can include a copper core or a copper pillar.

In some embodiments, the first filter device can include a transmit filter, and the second filter device can include a receive filter. The transmit filter can be configured to support a plurality of respective frequency bands, and the receive filter can be configured to support a plurality of respective frequency bands. The frequency bands associated with the transmit filter can be the same as the frequency bands associated with the receive filters. In some embodiments, first filter device does not include any receive filter, and the second filter device does not include any transmit filter.

In some embodiments, the radio-frequency device can further include a mold structure implemented over the substrate to substantially encapsulate the first and second filter devices.

According to a number of implementations, the present disclosure relates to a method for fabricating a radio-frequency device. The method includes providing or forming a substrate, and positioning a nested device on the substrate such that support structures associated with the nested device are between the nested device and a respective mounting surface of the substrate. The method further includes positioning a nesting device on the substrate such that support structures associated with the nesting device are between the nesting device and a respective mounting surface of the substrate, such that at least a portion of the nested device is positioned in a space defined by an underside of the nesting device and the support structures associated with the nesting device.

In some embodiments, the method can further include providing solder material, prior to the positioning of the nested device and the positioning of the nesting device, to contact pads associated with the support structures of the nested device and the nesting device. The method can further include performing a reflow operation to melt the solder material to thereby form reflowed solder for the respective support structures. The reflow operation can be performed after the positioning of the nested device and the nesting device.

In some embodiments, the nested device can be a receive filter, and the nesting device can be a transmit filter.

In some embodiments, the providing or forming of the substrate can includes providing or forming a substrate having multiple layers including a first layer at an upper side of the substrate and a second layer underneath the first layer. The positioning of the nested device can be performed prior to the positioning of the nesting device.

In some embodiments, the nesting device can be positioned on the first layer. In some embodiments, the nested device can be positioned on the first layer. In some embodiments, the method can further include providing or forming a cavity that is defined by at least the first layer and including a floor, such that the nested device is mounted on the floor of the cavity.

In some embodiments, the method can further include forming a mold structure over the substrate to substantially encapsulate the nested and nesting devices.

In a number of implementations, the present disclosure relates to a packaged module that includes a packaging substrate configured to receive a plurality of components, and a filter assembly implemented relative to the packaging substrate. The filter assembly includes first and second filter devices arranged in a nested manner such that at least a portion of the second filter device is positioned in a space defined by an underside of the first filter device.

In some embodiments, the first and second filter devices can be mounted on the packaging substrate. In some embodiments, the first and second filter devices can be mounted on another substrate which is then mounted on the packaging substrate.

In some teachings, the present disclosure relates to a wireless device that includes a transceiver, an antenna in communication with the transceiver and configured to support either or both of transmit and receive operations, and a radio-frequency module implemented between the transceiver and the antenna. The radio-frequency module includes a substrate and first and second filter devices mounted on the substrate with respective support structures, such that at least a portion of the second filter device is positioned in a space defined by an underside of the first filter device and the support structures for the first filter device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
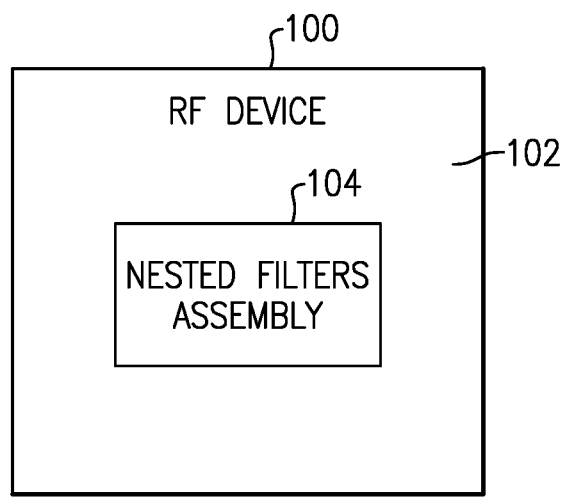
FIG. 1 depicts a packaged radio-frequency (RF) device having a substrate and an assembly of nested filters.

FIG. 1 depicts a packaged radio-frequency (RF) device 100 having a substrate 102 and an assembly 104 of nested filters. Various examples related to the packaged device 100 are described herein in greater detail. While some of such examples are described in the context of nested filters, it will be understood that one or more features related to the nesting configurations can be implemented with other electronic devices such as RF devices.

Figure 2:
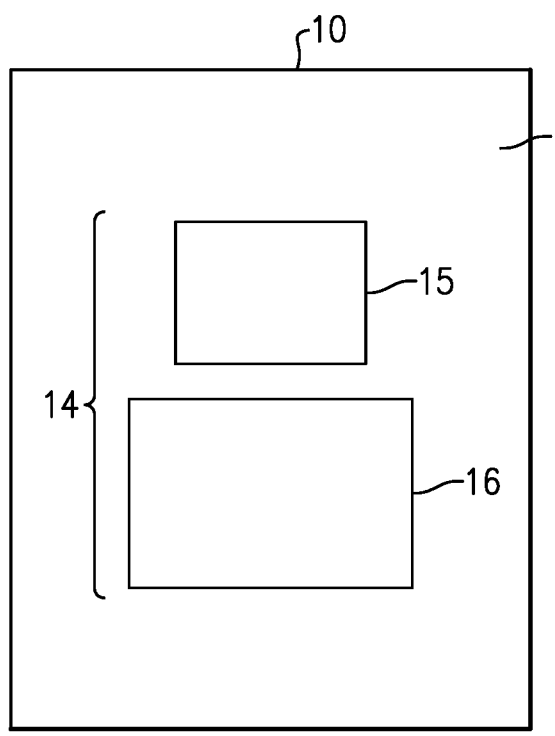
FIG. 2 shows a packaged RF device having a substrate and an assembly of filters mounted in a spread-out configuration on the substrate.

FIG. 2 shows a packaged RF device 10 having a substrate 12 and an assembly 14 of filters (15, 16) mounted on the substrate 12. In the example of FIG. 2, the two filters (15, 16) of the assembly 14 are shown to be arranged on the substrate 12 in a spread-out configuration, to occupy a relatively large footprint area.

Figure 3:
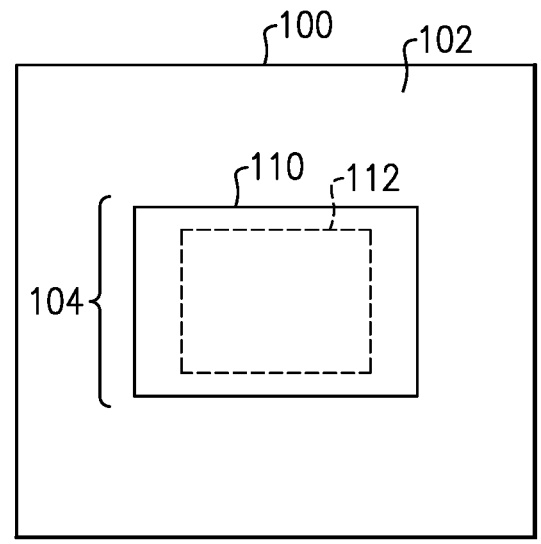
FIG. 3 shows a packaged RF device having a substrate and an assembly of filters mounted in a nested configuration on the substrate.

FIG. 3 shows a packaged RF device 100 having a substrate 102 and an assembly 104 of filters (110, 112) mounted on the substrate 102. In the example of FIG. 3, the two filters (110, 112) of the assembly 104 are shown to be arranged on the substrate 102 in a nested configuration, to occupy a reduced footprint area.

If one assumes that the two filters in the example of FIG. 2 are similarly sized as the respective filters of FIG. 3, one can see that the significantly reduced footprint of the filter assembly 104 allows the packaged RF device 100 (of FIG. 3) to also have a significantly reduced lateral area when compared to the lateral area of the packaged device 10 of FIG. 2.

By way of a specific example in an RF application, it is noted that power amplifier with integrated duplexer (PAiD) modules continue to increase in functionality. Support for new frequency bands are being added, while the overall module sizes are expected to decrease significantly. Further, costs of such modules are expected to be reduced. It is further noted that in a typical current low band PAiD module, up to about 70% of the available area on a top surface of a substrate is occupied with duplexers. Thus, to achieve reduction in module size, significant reduction in footprint of the duplexers is important.

In some embodiments, reduction in duplexer footprint can be achieved with tighter spacing and feature size design rules within the filters themselves, reduced spacing between duplexers mounted on a module substrate, stacking of duplexers in a face-to-face or back-to-back configuration, and/or embedding duplexers within a module substrate. Each of such embodiments has a combination of tradeoffs with respect to cost, size, thickness, cycle time, and manufacturing infrastructure.

In some embodiments, a packaged device having one or more features as described herein can include an assembly of nested filters to provide a significant reduction in surface mount area. In the context of the foregoing PAiD application, it is estimated that the surface mount area can be reduced by approximately 30%. More specific details of such PAiD application are described herein in greater detail.

Figure 4:
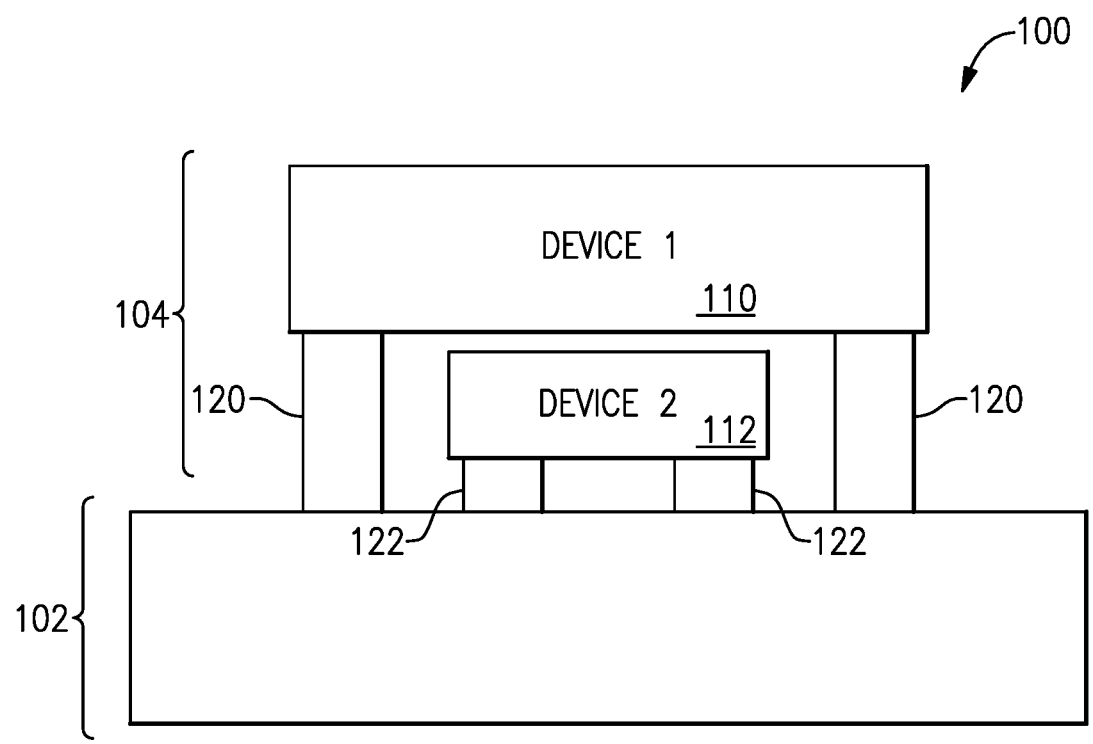
FIG. 4 shows that in some embodiments, a packaged device can include a substrate having a first side for supporting an assembly of nested devices, and a second side configured to allow the packaged device to be mounted to a circuit board.
Figure 5:
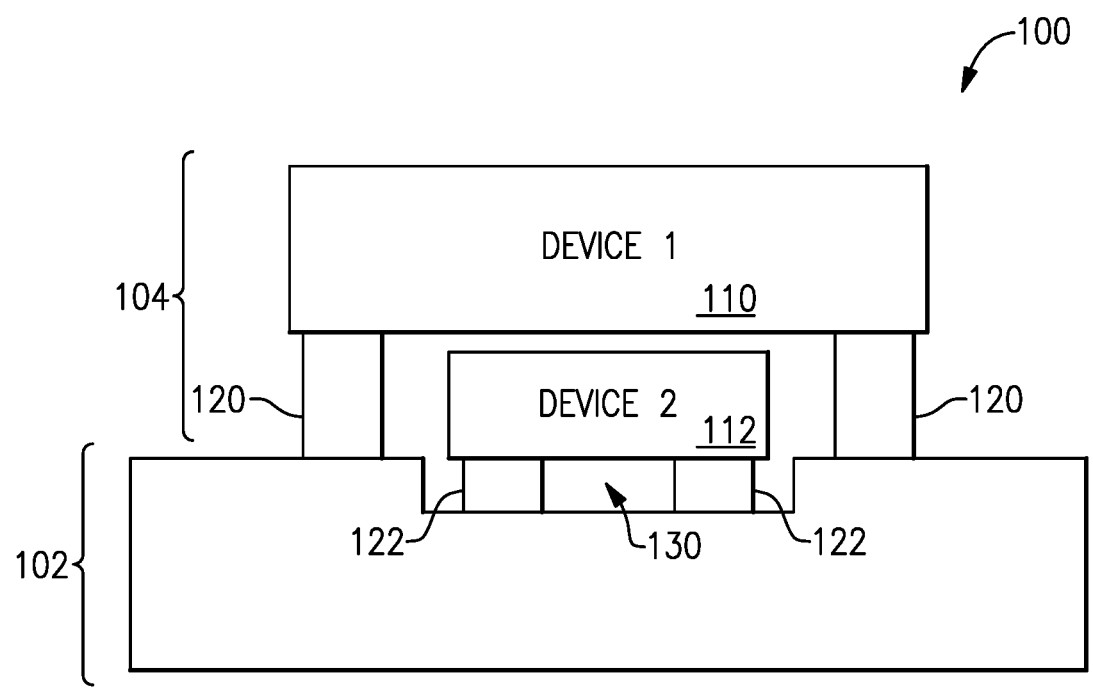
FIG. 5 shows that in some embodiments, a packaged device can include a substrate having a first side with a cavity for supporting an assembly of nested devices, and a second side configured to allow the packaged device to be mounted to a circuit board.

FIGS. 4 and 5 show examples of nesting configurations that can be implemented for a packaged device. Such a packaged device can be a packaged RF device (e.g., a PAiD module or a module for other RF applications), or a packaged device for non-RF applications.

FIG. 4 shows that in some embodiments, a packaged device 100 can include a substrate 102 having a first side for supporting an assembly 104 of nested devices 110, 112, and a second side configured to allow the packaged device 100 to be mounted to a circuit board. In the example of FIG. 4, the first device 110 is shown to be mounted and supported over the first side of the substrate 102 by a plurality of support structures 120, so as to be positioned over the second device 112 which is also mounted and supported over the first side of the substrate 102 by a plurality of support structures 122. Accordingly, the second device 112 is nested within a space defined by the underside of the first device 110, the support structures 120, and the first side of the substrate 102.

In the example of FIG. 4, the underside of the first device 110 is depicted as being separated from the upper side of the second device 112 by a gap. It will be understood that such a gap may or may not exist, such that the underside of the first device 110 may or may not touch the upper side of the second device 112.

FIG. 5 shows that in some embodiments, a packaged device 100 can include a substrate 102 having a first side for supporting an assembly 104 of nested devices 110, 112, and a second side configured to allow the packaged device 100 to be mounted to a circuit board. In the example of FIG. 5, the first device 110 is shown to be mounted and supported over the first side of the substrate 102 by a plurality of support structures 120, so as to be positioned over the second device 112 which is also mounted and supported over the first side of the substrate 102 by a plurality of support structures 122.

In the example of FIG. 5, the first side of the substrate 102 is shown to define a cavity 130 that is dimensioned to allow the second device 112 to be mounted at a level within the cavity 130 that is lower than the portion of the first side of the substrate 102 outside of the cavity 130. Accordingly, the second device 112 is nested within a space defined by the underside of the first device 110, the support structures 120, and the cavity 130 of the first side of the substrate 102.

In some embodiments, the foregoing cavity structure 130 can provide flexibility in how the assembly 104 of nested devices 110, 112 can be configured and/or arranged. For example, if the first and second devices 110, 112 of FIG. 5 are similarly dimensioned as the first and second devices 110, 112 of FIG. 4, the overall height of the assembly 104 in FIG. 5 can be lower than the overall height of the assembly 104 in FIG. 4, with the support structures 120 in FIG. 5 being shorter. In another example, if the first and second devices 110, 112 and their respective support structures (120, 122) of FIG. 5 are similarly dimensioned as the first and second devices 110, 112 and their respective support structures (120, 122) of FIG. 4, the second device 112 can be separated by a greater gap in the example of FIG. 5.

Figure 6:
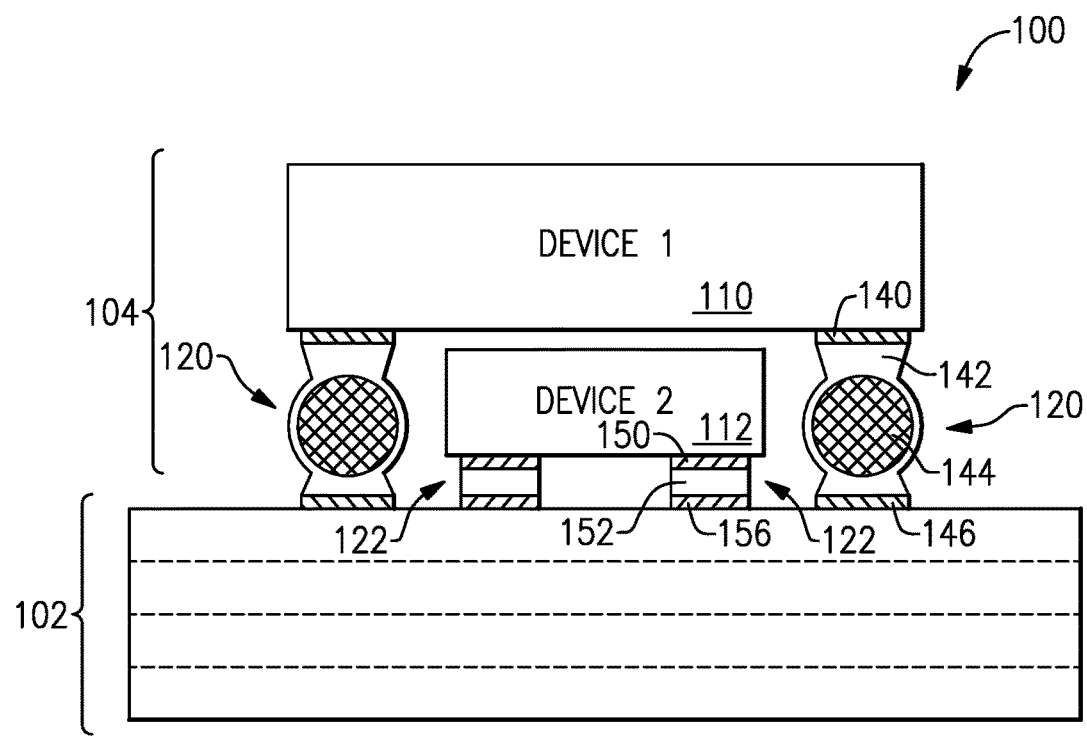
FIG. 6 shows a more specific example of the packaged device of FIG. 4, where support structures can be implemented as solder balls having respective copper cores.
Figure 7:
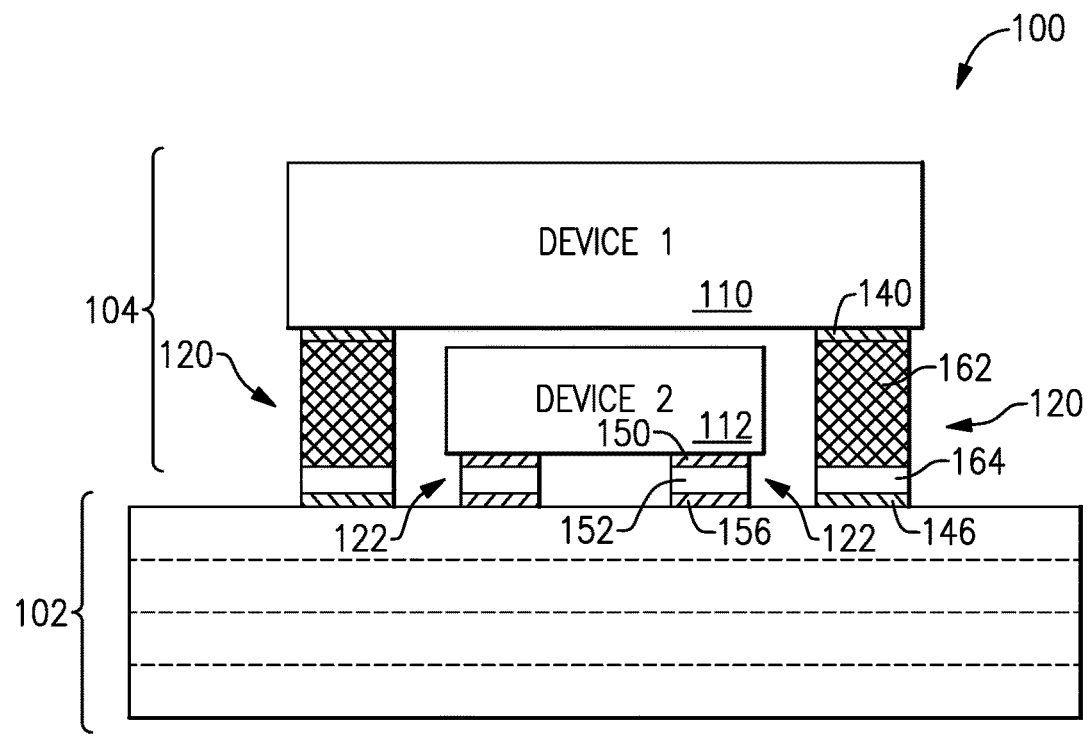
FIG. 7 shows another more specific example of the packaged device of FIG. 4, where support structures can be implemented as copper pillars.
Figure 8:
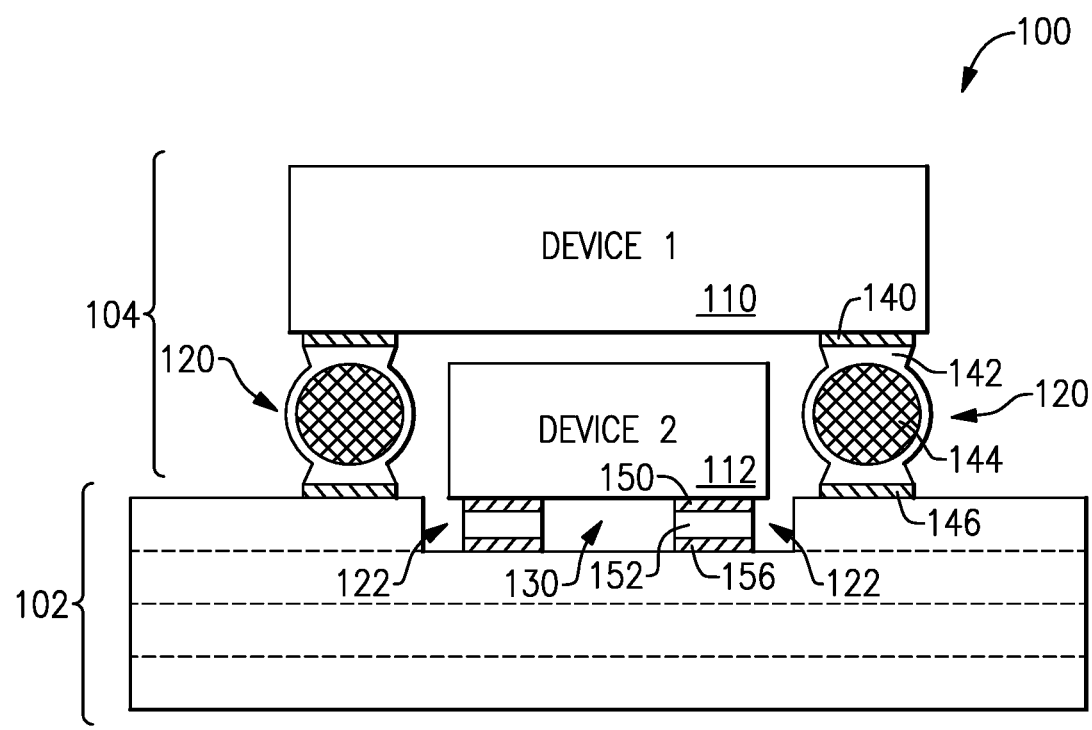
FIG. 8 shows a more specific example of the packaged device of FIG. 5, where support structures can be implemented as solder balls having respective copper cores.
Figure 9:
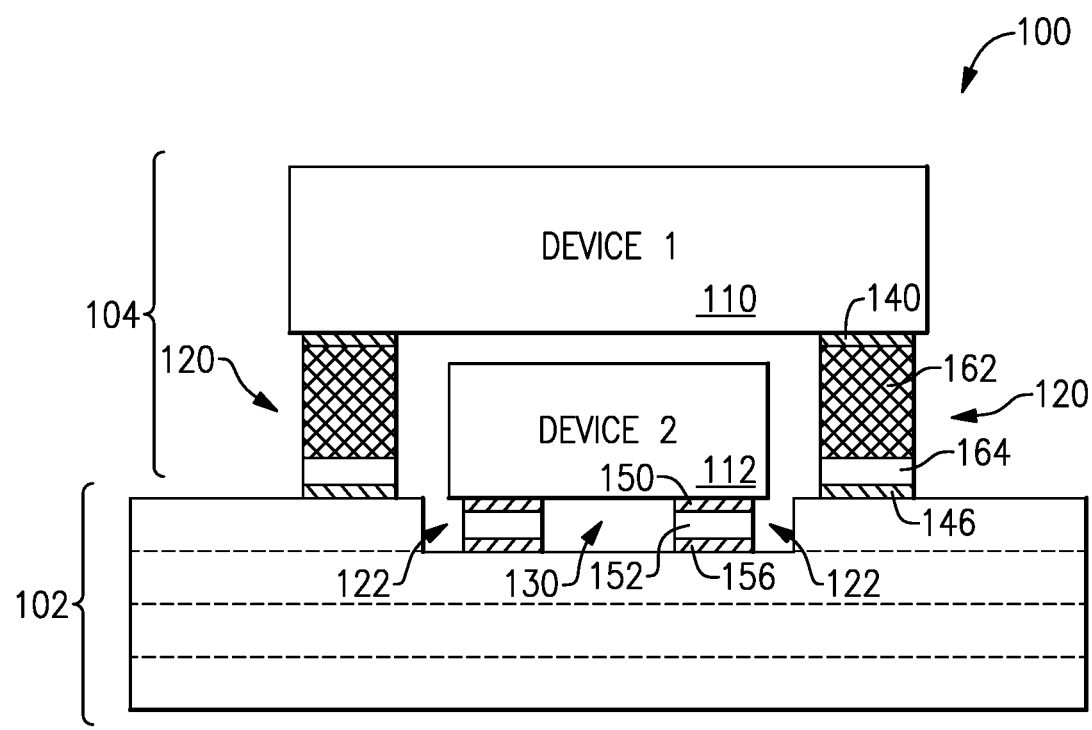
FIG. 9 shows another more specific example of the packaged device of FIG. 5, where support structures can be implemented as copper pillars.

FIGS. 6 and 7 show more specific examples of the support structures 120 and 122 of the packaged device 100 of FIG. 4, in which the first side of the substrate 102 is generally flat. FIGS. 8 and 9 show more specific examples of the support structures 120 and 122 of the packaged device 100 of FIG. 5, in which the first side of the substrate 102 includes a cavity 130.

In each of the examples of FIGS. 6-9, the substrate 102 is shown to include four layers. Such layers can be, for example, laminate layers, ceramic layers, etc. It will be understood that a substrate for a packaged device having one or more features as described herein can have more or less number of layers.

For the purpose of description of FIGS. 6-9, the first device 110 can be referred to as a nesting device, and the second device 112 can be referred to as a nested device. As seen in each of the examples of FIGS. 6-9, the nested device 112 is mounted relatively close to its mounting surface, and the nesting device 110 is mounted further away from its mounting surface due to the need to provide the space to accommodate the nested device 112.

FIGS. 6-9 show that in some embodiments, the nested device 112 can be mounted to its respective mounting surface by a plurality of support structures 122. Each of such support structures can include, for example, a solder structure 152 formed between a contact pad 156 on the mounting surface of the substrate 102 and a contact pad 150 on the underside of the nested device 112. Examples of how such solder structures (152) can be formed are described herein in greater detail.

It is noted that in each of the examples of FIGS. 6 and 7, the contact pads 156 for the solder structures 152 are formed on a generally flat upper surface of the first layer (L1) of the substrate 102. Accordingly, each of the corresponding nested devices 112 in FIGS. 6 and 7 is mounted on the generally flat upper surface of the substrate 102.

In each of the examples of FIGS. 8 and 9, the contact pads 156 for the solder structures 152 are formed on the recessed surface at the floor of a cavity 130 of the substrate 102. In some embodiments, such a cavity can have a depth similar to the thickness of the first layer (L1) of the substrate 102. In such a configuration, the contact pads 156 can be implemented on the second layer (L2), and the resulting surface of the L2 layer can be the floor of the cavity 130. Accordingly, each of the corresponding nested devices 112 in FIGS. 8 and 9 is mounted on the recess floor of the cavity 130 of the substrate 102.

FIGS. 6 and 8 show that in some embodiments, the nesting device 110 can be mounted to its respective mounting surface by a plurality of support structures 120. Each of such support structures can include, for example, a solder ball having a copper core 144. Such a copper core can be dimensioned to provide a desired height and enhanced support between the underside of the nesting device 110 and the respective mounting surface on the substrate 102, when solder portion 142 is formed about the copper core 144. Examples of how such solder ball structures can be formed are described herein in greater detail.

It is noted that in each of the examples of FIGS. 6 and 8, contact pads 146 for the solder balls of the support structures 120 are implemented on an upper surface of the first layer (L1) of the substrate 102. Similarly, contact pads 140 for the solder balls of the support structures 120 are implemented on an underside surface of the nesting device 110.

In the examples of FIGS. 6 and 8, the copper cores 144 can provide an enhanced support that is electrically conductive for the nesting device 110, such that the nesting device 110 is provided with sufficient height over the nested device 112. Accordingly, even if the solder portion 142 of the support structure 120 fails or melts, the presence of the copper cores 144 can prevent collapse of the nesting device 110 onto the nested device 112.

FIGS. 7 and 9 show that other forms of enhanced support can be provided for nesting devices. For example, copper pillars 162 can be implemented on respective contact pads 140 on the underside of a nesting device 110. Such copper pillars can be formed by, for example, a plating process.

In the examples of FIGS. 7 and 9, the copper pillars 162 are shown to be mounted onto respective contact pads 146 of the substrate 102 through respective solder structures 164. In such a mounting configuration, the copper pillars 162 can be formed on the underside of the nesting device 110 prior to the nesting device 110 being mounted onto the substrate 102. However, it will be understood that other mounting sequences can be implemented. For example, copper pillars can be formed on the substrate, and a pillar-less nesting device can be mounted onto such in-place pillars. In another example, pre-formed copper pillars can be dropped onto the substrate, and a pillar-less nesting device can be mounted onto such in-place pillars.

Figure 10:
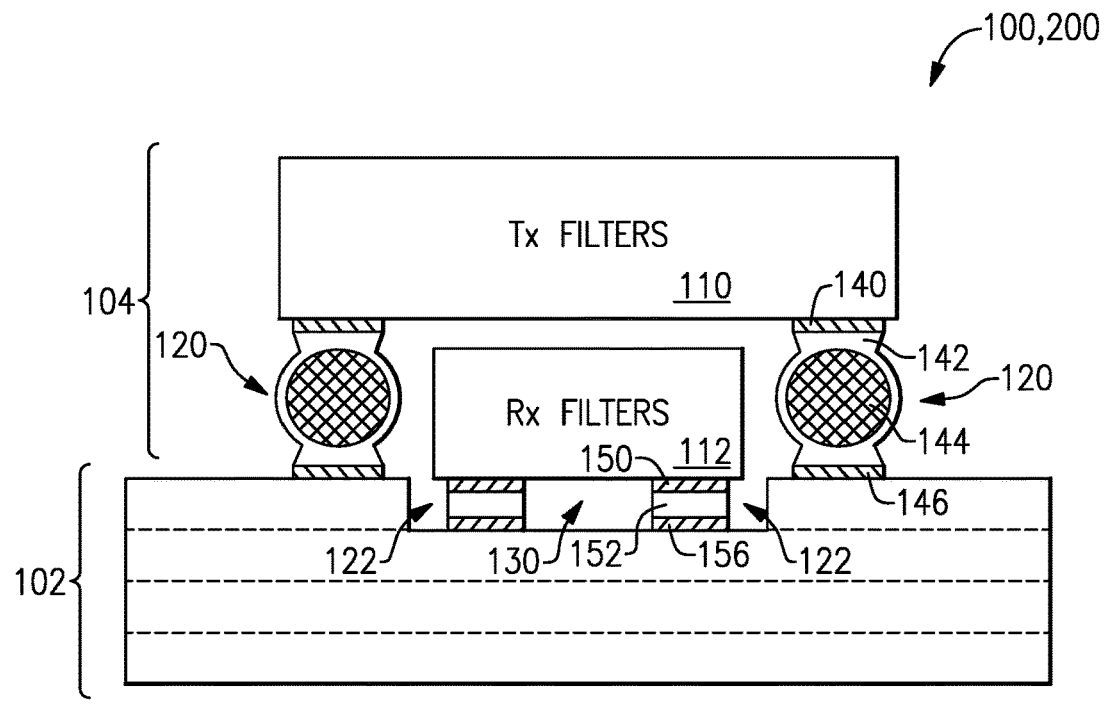
FIG. 10 shows that in some embodiments, a packaged device having one or more features as described herein can be implemented as an RF filter device.

FIG. 10 shows that in some embodiments, a packaged device 100 having one or more features as described herein can be implemented as an RF filter device 200. In the example of FIG. 10, the packaged RF filter device 100/200 is depicted as having an example nesting configuration similar to the example of FIG. 8. However, it will be understood that a packaged RF filter device having one or more features as described herein can be implemented with other nesting configurations.

It is noted that for a given frequency band, a transmit (Tx) filter typically occupies a larger area than a receive (Rx) filter. Thus, in some embodiments, a nested assembly 104 of filters can include a Tx filter device 110 implemented as a nesting device, and an Rx filter device 112 implemented as a nested device.

For the purpose of description, the Tx and Rx filter devices 110, 112 can be configured to support respective frequency ranges in one or more operating bands. For example, the Tx filter device 110 can be configured to support a transmit portion of band A, and the Rx filter device 112 can be configured to support a receive portion of band A. In another example, the Tx filter device 110 can be configured to support a transmit portion of band A and a transmit portion of band B, and the Rx filter device 112 can be configured to support a receive portion of band A and a receive portion of band B. In another example, the Tx filter device 110 can be configured to support a transmit portion of each of more than two bands, and the Rx filter device 112 can be configured to support a receive portion of each of the same more than two bands.

Although various examples are described herein in the context of the nesting and nested filters supporting respective portions of a same operating band, it will be understood that one or more features of the present disclosure can be implemented in configurations where nesting and nested (e.g., Tx and Rx) filter devices support respective portions of different bands. For example, a Tx filter device can be configured to support a transmit portion of band A, and an Rx filter device can be configured to support a receive portion of band B. In such an example, the Tx filter device may or may not support a transmit portion of band B, and the Rx filter device may or may not support a receive portion of band A.

FIGS. 11A-11F show various stages of an example process that can be implemented to fabricate the example packaged RF filter device 200 of FIG. 10. It will be understood that appropriate processes can also be implemented to fabricate other example packaged devices disclosed herein.

Figure 11A:
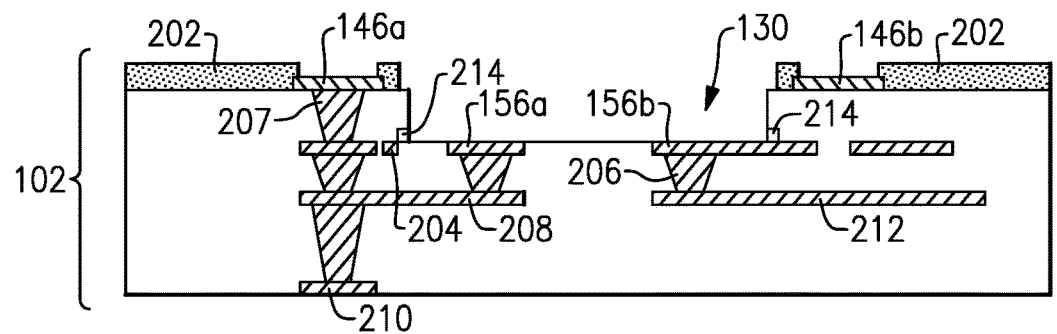
FIGS. 11A to 11F show various stages of an example process that can be implemented to fabricate the example packaged RF filter device of FIG. 10.

FIG. 11A shows a side sectional view of a substrate 102 configured to receive an Rx filter device on a mounting area within a cavity 130, and to receive a Tx filter device on a mounting area on an upper surface of the substrate 102, so as to allow the Tx and Rx filter devices to be arranged in a nested configuration. In the example of FIG. 11A, the substrate 102 has four layers; however, it will be understood that other numbers of layers can also be utilized.

Referring to FIG. 11A, the floor of the cavity 130 is shown to include example contact pads 156a, 156b. The contact pad 156a is depicted as being electrically connected to a contact pad 210 at an underside of the substrate 102, through a conductive via, a conductive path 208, and another conductive via. The contact pad 156b is depicted as being electrically connected to a conductive plane 212 within the substrate 102, through a conductive via 206.

For the purpose of description, the contact pad 210 at the underside of the substrate 102 can be utilized to route RF signals to and/or from an antenna, and the conductive plane 212 can be utilized as a ground plane. It will be understood that the ground plane 212 can be electrically connected to a grounding contact pad at the underside of the substrate 102 through one or more vias. It will also be understood that one or more other contact pads can be implemented on the floor of the cavity 130 to support, for example, routing of a signal received through the contact pad 156a and filtered by the Rx filter device.

Referring to FIG. 11A, the upper surface of the substrate 102 is shown to include example contact pads 146a, 146b. The contact pad 146a is depicted as being electrically connected to the contact pad 210 at the underside of the substrate 102, through a conductive via 207 and lower conductive vias.

In the example context of the contact pad 210 at the underside of the substrate 102 being utilized to route RF signals to and/or from an antenna, contact pad 146b can be utilized as an input contact pad for routing a transmit signal into the Tx filter device. Accordingly, the contact pad 146b can be, for example, a transmit signal contact pad electrically connectable to a power amplifier. It will also be understood that in some embodiments, one or more other contact pads can be implemented on the upper surface of the substrate 102 to, for example, provide grounding connections for the Tx filter device.

In the example of FIG. 11A, the substrate 102 is depicted as including a mask layer 202 on its upper surface. Such a mask layer 202 can allow the contact pads 146a, 146b to be exposed for mounting of the Tx filter device, and to allow formation of the cavity 130.

In the example of FIG. 11A, the cavity 130 can be pre-formed when the substrate 102 is fabricated, be formed from a cavity-less substrate, or any combination thereof. In some embodiments, such a cavity can be formed by, for example, a laser ablation technique. In such a cavity formation context, the substrate 102 can include a laser stopper layer 214 configured to control lateral dimensions of the cavity being formed by the laser.

In the example of FIG. 11A, the substrate 102 is also shown to include a ground ring 204. Such a ground ring can be formed around the floor area of the cavity 130, and provide isolation between the Tx filter device and the Rx filter device.

Figure 11B:
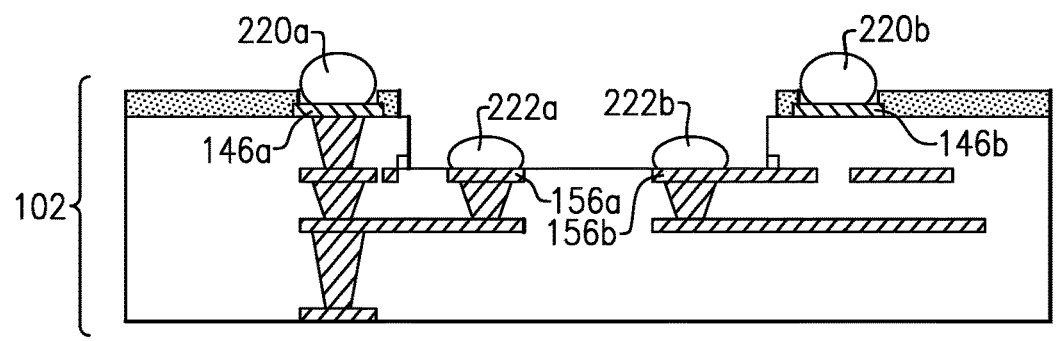

FIG. 11B shows a fabrication stage during which solder material is introduced onto the contact pads for mounting of the Rx filter device and the Tx filter device. More particularly, solders 222a, 222b are shown to be introduced on the respective contact pads 156a, 156b on the floor of the cavity. Similarly, solders 220a, 220b are shown to be introduced on the respective contact pads 146a, 146b on the upper surface of the substrate 102. In some embodiments, the foregoing solders can be introduced to their respective contact pads by, for example, printing, dropping of solder balls, etc.

Figure 11C:
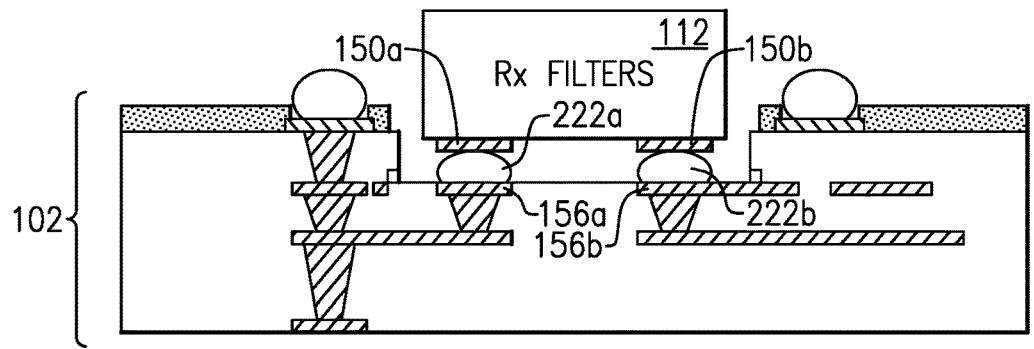

FIG. 11C shows a fabrication stage during which an Rx filter device 112 is positioned such that the contact pads 150a, 150b of the Rx filter device 112 engage the solders 222a, 222b. In some embodiments, at least the contact pads 150a, 150b of the Rx filter device 112 can be applied with flux (e.g., dipped in flux) prior to being positioned on the solders 222a, 222b.

Figure 11D:
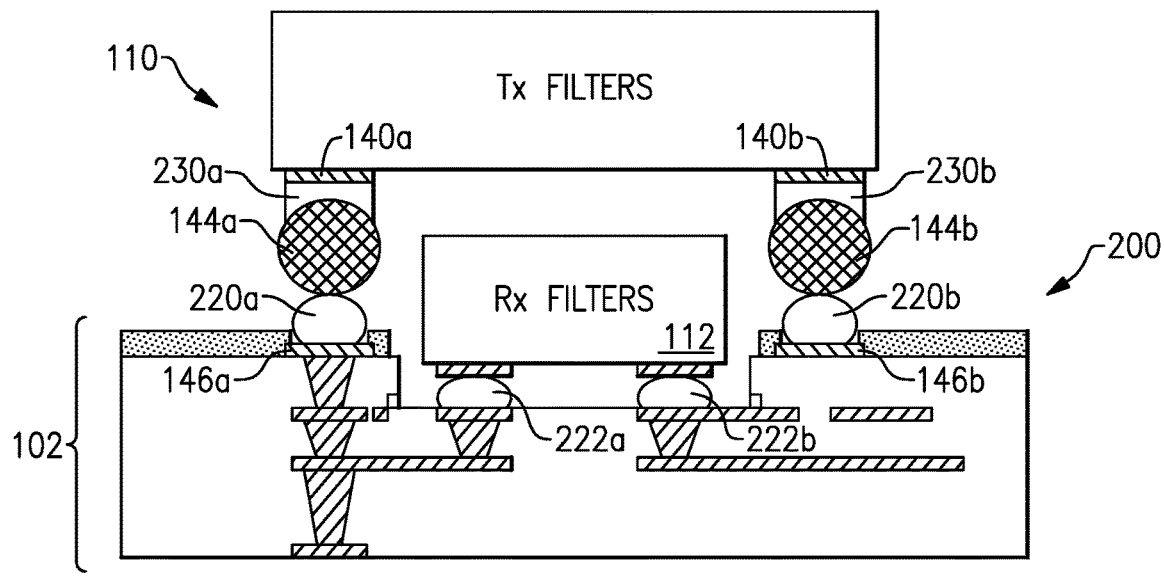

FIG. 11D shows a fabrication stage during which a Tx filter device 110 is positioned such that copper cores 144a, 144b that are already attached to the underside of the Tx filter device 110 engage the solders 220a, 220b. In some embodiments, at least the copper cores 144a, 144b on underside of the Tx filter device 110 can be applied with flux (e.g., dipped in flux) prior to being positioned on the solders 220a, 220b.

In the example of FIG. 11D, it is assumed that the copper cores 144a, 144b are already attached to the underside of the Tx filter device 110. Such attachment of the copper cores 144a, 144b can be achieved by, for example, introducing solder to the contact pads 140a, 140b, dropping the copper cores 144a, 144b onto the respective contact pads, and reflowing the solder so as to result in solder structures 230a, 230b. It will be understood that copper cores 144a, 144b can also be mounted onto the contact pads 146a, 146b (of the substrate 102) first, and a Tx filter device 110 without copper cores (but with solder on the contact pads 140a, 140b) can be positioned over the copper cores.

Figure 11E:
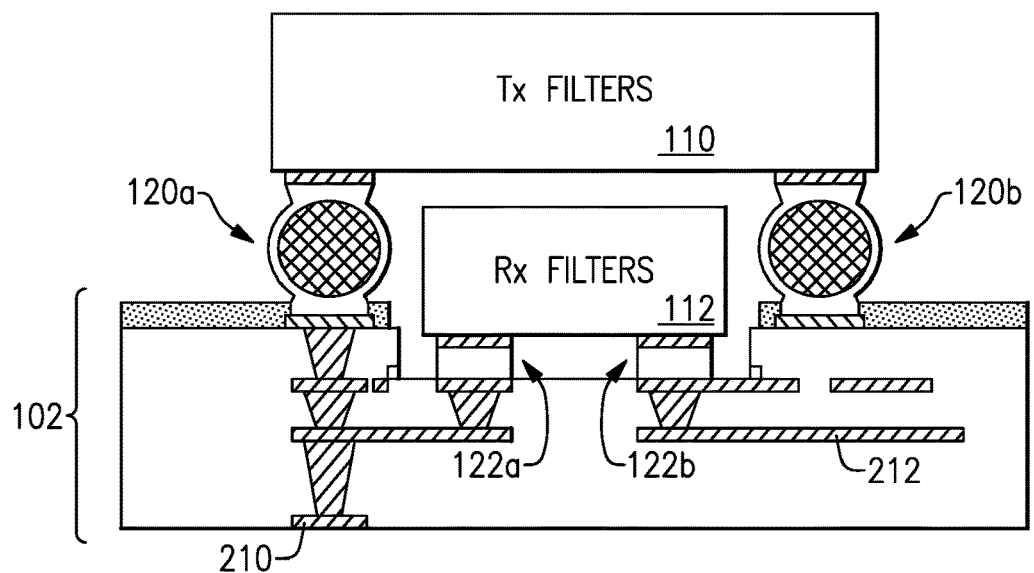

In some embodiments, the assembly as shown in FIG. 11D can be heated such that the solders (222a, 222b, 220a, 220b, 230a, 230b) are reflowed. FIG. 11E shows a fabrication stage in which such reflowing of the solders result in support structures 122a, 122b for the Rx filter device 112 and support structures 120a, 120b for the Tx filter device 110.

Figure 11F:
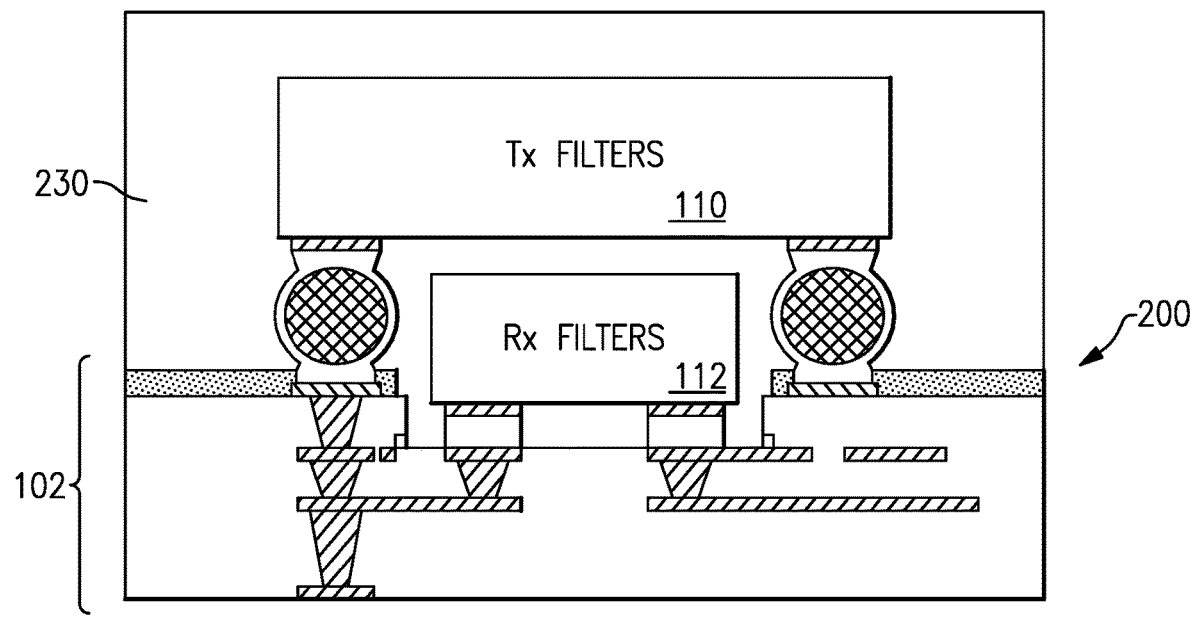

FIG. 11F shows a fabrication stage in which a mold cap 230 can be formed over the substrate 102 so as to substantially encapsulate the nested assembly of the Tx filter device 110 and the Rx filter device 112, so as to result in a packaged RF filter device 200. In some embodiments, such a mold cap can be formed by a molding process (e.g., injection molding, compression molding, etc.).

In the example process of FIGS. 11A-11F, various stages of fabrication are depicted for one packaged device. It will be understood that in some embodiments, some or all of the fabrication process can be performed for an array of joined individual units. For example, the individual substrate 102 in FIG. 11A can be part of a substrate sheet having an array of such individual substrate units. Assuming that the remaining stages associated with FIGS. 11B-11F are also implemented while in such an array format, the packaged RF filter device 200 of FIG. 11F can be one of an array of similar units joined together. In such a fabrication process, an additional step can be implemented to singulate the array into a plurality of individual packaged RF filter devices.

It is noted that since a Tx filter is typically larger than a corresponding Rx filter (e.g., Tx filter can occupy about 70% of a total footprint area if arranged in a same plane in a spread-out configuration), nesting of the Tx and Rx filter devices as described herein (with appropriate interconnect structures for the Tx and Rx filter devices) can be achieved with no increase in lateral dimension of the Tx filter device. Similarly, no decrease in lateral dimension of the Rx filter device is needed for such a nested configuration. Accordingly, costs associated filter devices do not need to be increased.

As described herein, and as necessary or desired, a cavity structure can be utilized for mounting of a nested device (e.g., an Rx filter device) onto, for example, a second layer (L2) or a third layer (L3) of a substrate. Such a mounting configuration can provide additional clearance in the vertical direction (when the substrate is assumed to be on a horizontal plane), to thereby provide greater flexibility in nesting configurations of the nested and nesting devices.

Figure 12:
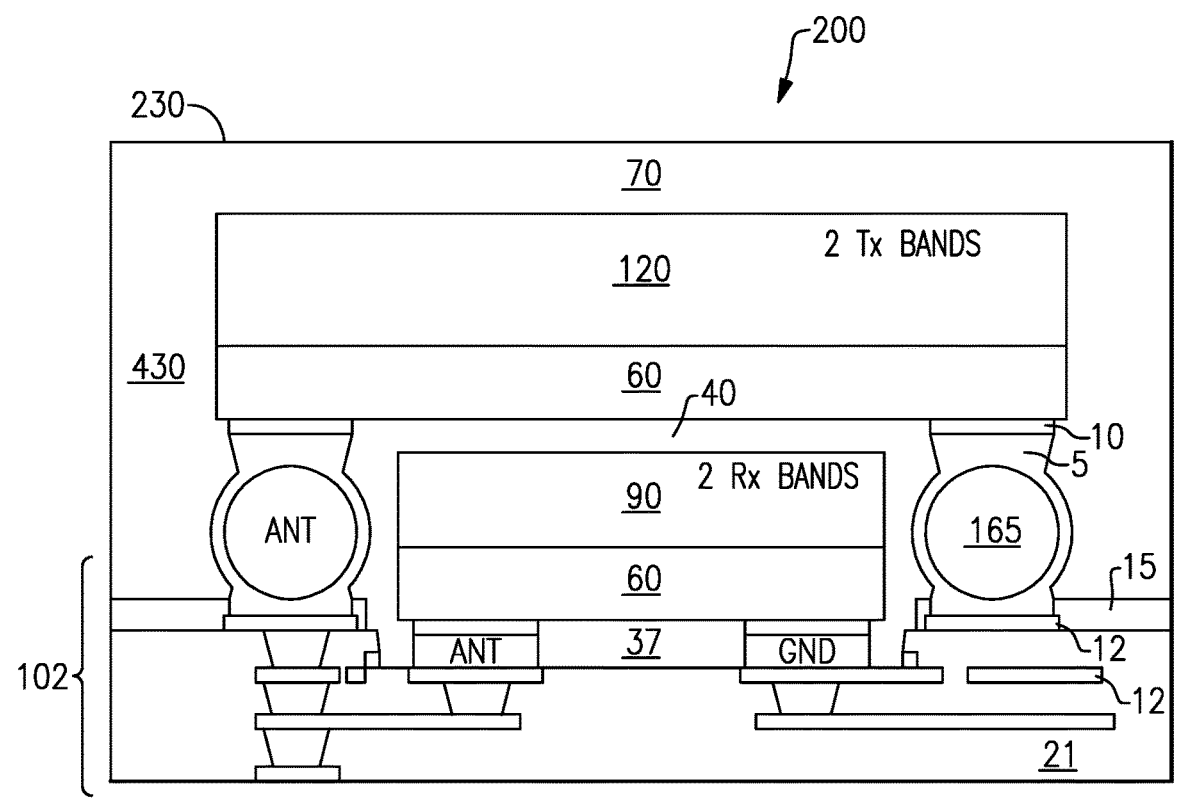
FIG. 12 shows a packaged RF filter device that can be a more specific example of the packaged RF filter device of FIG. 11F.

FIG. 12 shows a packaged RF filter device 200 that is a more specific example of the packaged RF filter device 200 of FIG. 11F. In the example of FIG. 12, the Tx filter device (nesting device) can be configured to support two Tx bands, and the Rx filter device (nested device) can be configured to support two corresponding Rx bands. Along with the example of FIG. 12, examples of various configurations in FIGS. 13A-13E assume that the two Tx bands are B28A (Tx) and B28B (Tx) cellular bands, and the two Rx bands are B28A (Rx) and B28B (Rx) cellular bands. It will be understood that other combinations of bands can also be supported by a packaged RF filter device having one or more features as described herein.

In the example of FIG. 12, thickness estimates are provided for various portions of the packaged RF filter device 200. It will be understood that some or all of such thicknesses can be varied as needed or desired.

Referring to FIG. 12, and assuming that the substrate 102 has a thickness of approximately 207 μm, the overall thickness of the packaged RF filter device 200 is approximately 637 μm without including a ball grid array (BGA) (not shown) underneath the substrate 102. If such a BGA is assumed to provide an additional thickness of 180 μm, the total height of the packaged RF filter device 200 (with the BGA) is approximately 817 μm.

In the example of FIG. 12, the left support structure (122a in FIG. 11E) associated with the Rx filter device 112 and the left support structure (120a in FIG. 11E) associated with the Tx filter device 110 are depicted as providing electrical connections to an antenna (ANT). In the same example of FIG. 12, the right support structure (122b in FIG. 11E) associated with the Rx filter device 112 is depicted as being an electrical connection to a ground (GND). Such connection pin assignments can be designed appropriately to support two example bands.

Figure 13A:
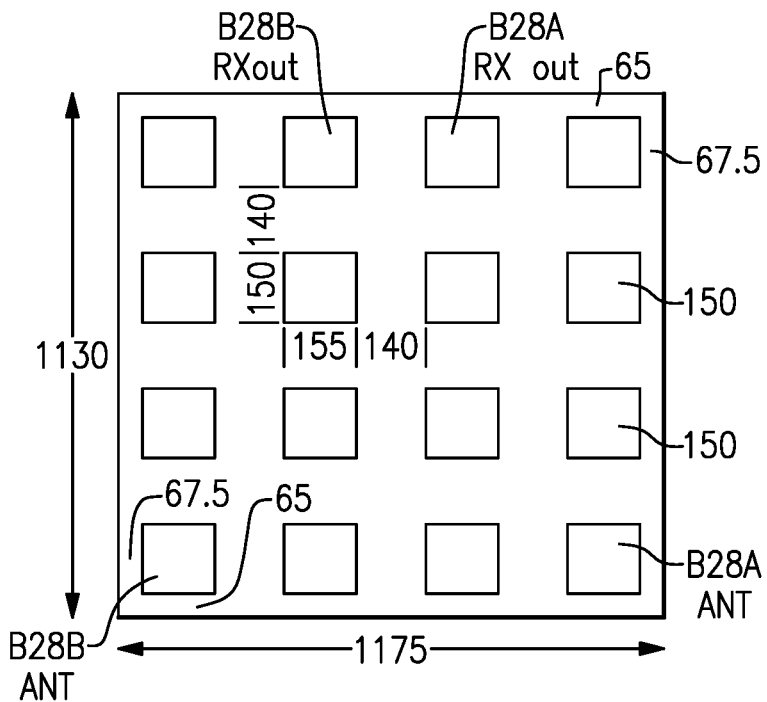
FIG. 13A shows an underside view of a receive filter device of FIG. 12 with example connection pin assignments for an array of contact pads.

For example, FIG. 13A shows an underside view of the Rx filter device 112 of FIG. 12 with example connection pin assignments for an array of contact pads 150. Antenna contact pads for B28A and B28B bands are shown, as well as signal output pads (Rxout) for the same bands. Some or all of the other contact pads can be utilized as grounding connections.

Figure 13B:
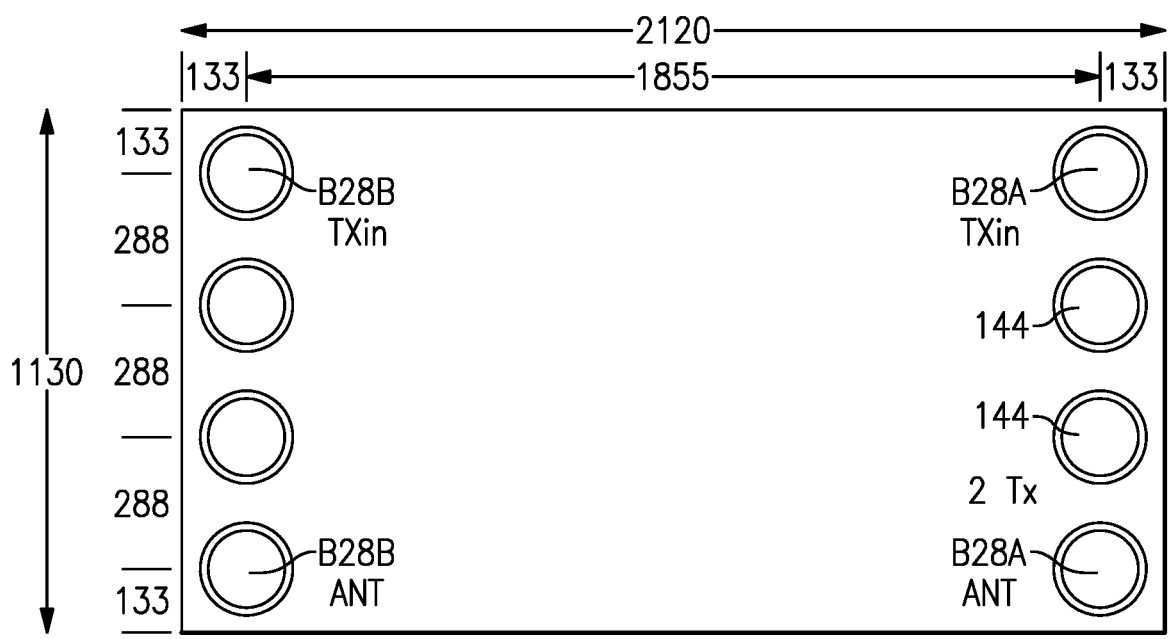
FIG. 13B shows an underside view of a transmit filter device of FIG. 12 with example connection pin assignments for an array of copper cores.

In another example, FIG. 13B shows an underside view of the Tx filter device 110 of FIG. 12 with example connection pin assignments for an array of copper cores 144. Antenna contact pads for B28A and B28B bands are shown, as well as signal input pads (Txin) for the same bands. Some or all of the other contact pads can be utilized as grounding connections.

In FIGS. 13A and 13B, various example lateral dimensions are shown for the undersides of the Rx and Tx filter devices. It will be understood that such dimensions can be adjusted appropriately to, for example, accommodate the filter device designs, and/or to accommodate footprint requirements when such devices are mounted on a circuit board.

Figure 13C:
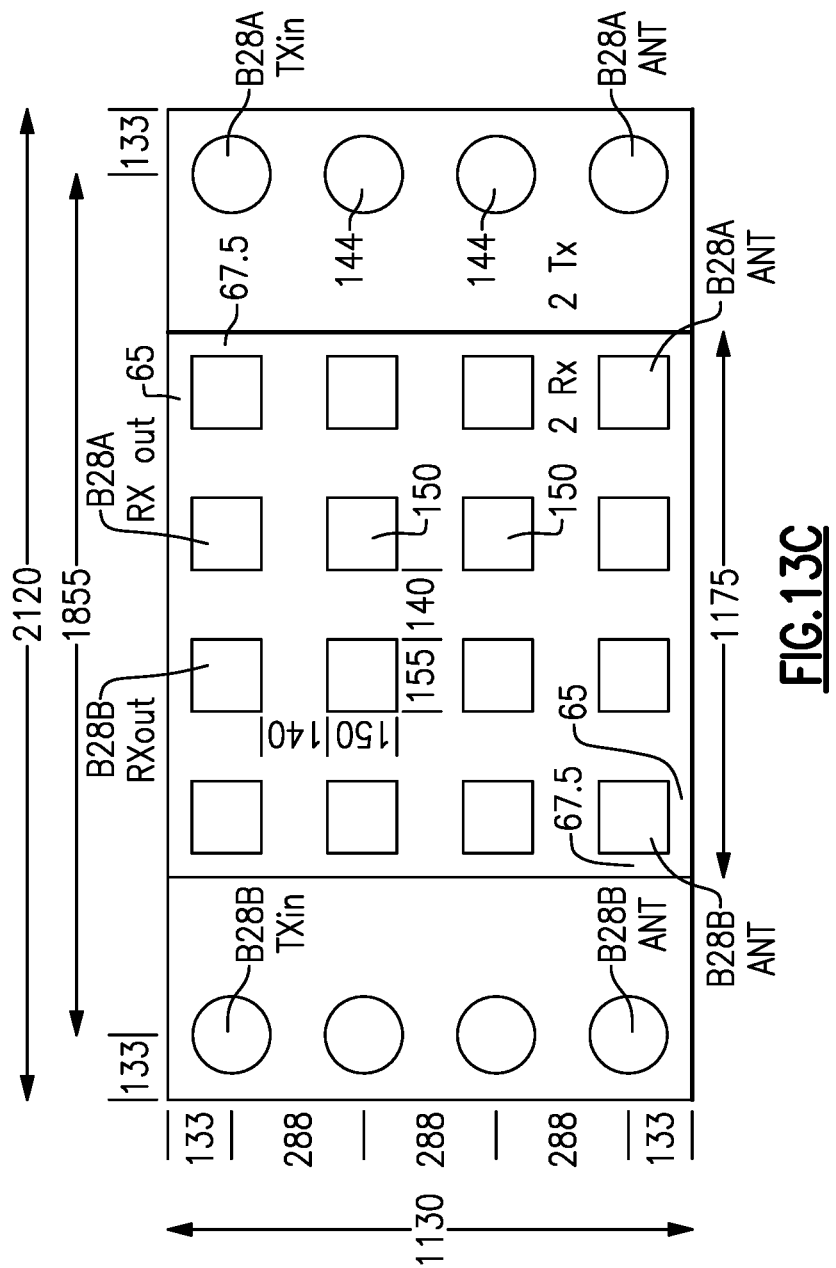
FIG. 13C shows an underside view of the nested arrangement of the receive filter device and the transmit filter device.

FIG. 13C shows an underside view of the nested arrangement of the Rx filter device (nested) and the Tx filter device (nesting). In FIGS. 13A-13C, various example lateral dimensions are shown; however, it will be understood that such dimensions can be adjusted appropriately.

Figure 13D:
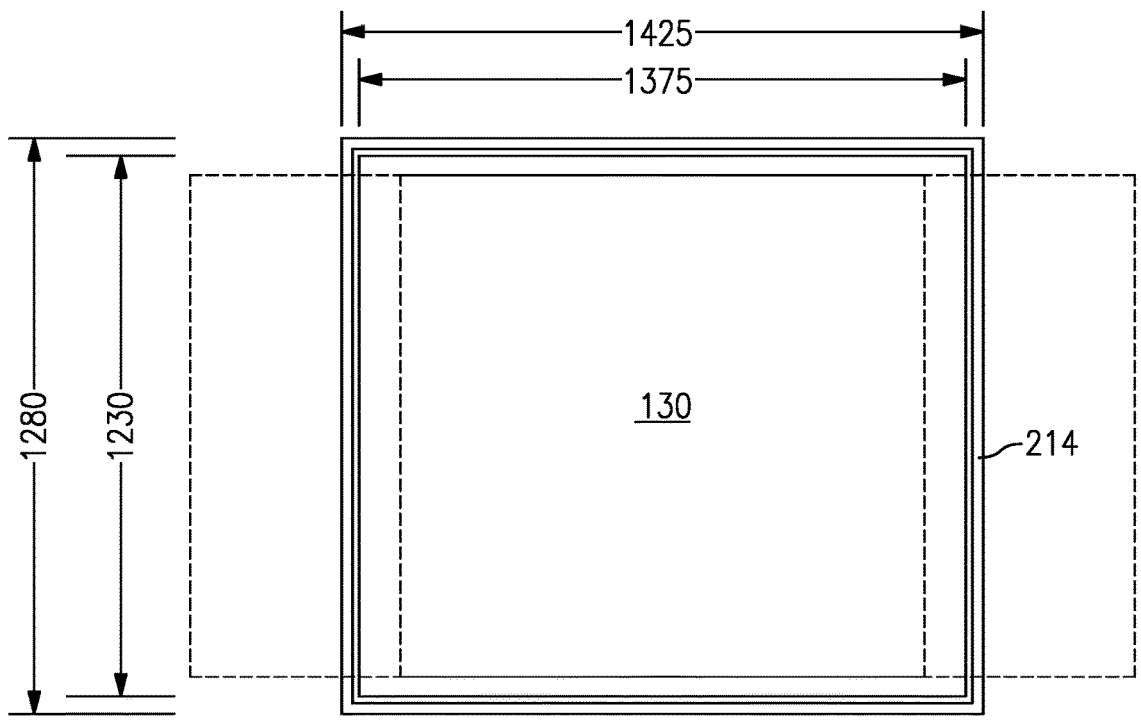
FIG. 13D shows an example layout design of a laser stopper layer that can be implemented on a layer of the substrate of the RF filter device of FIGS. 11A-11F.
Figure 13E:
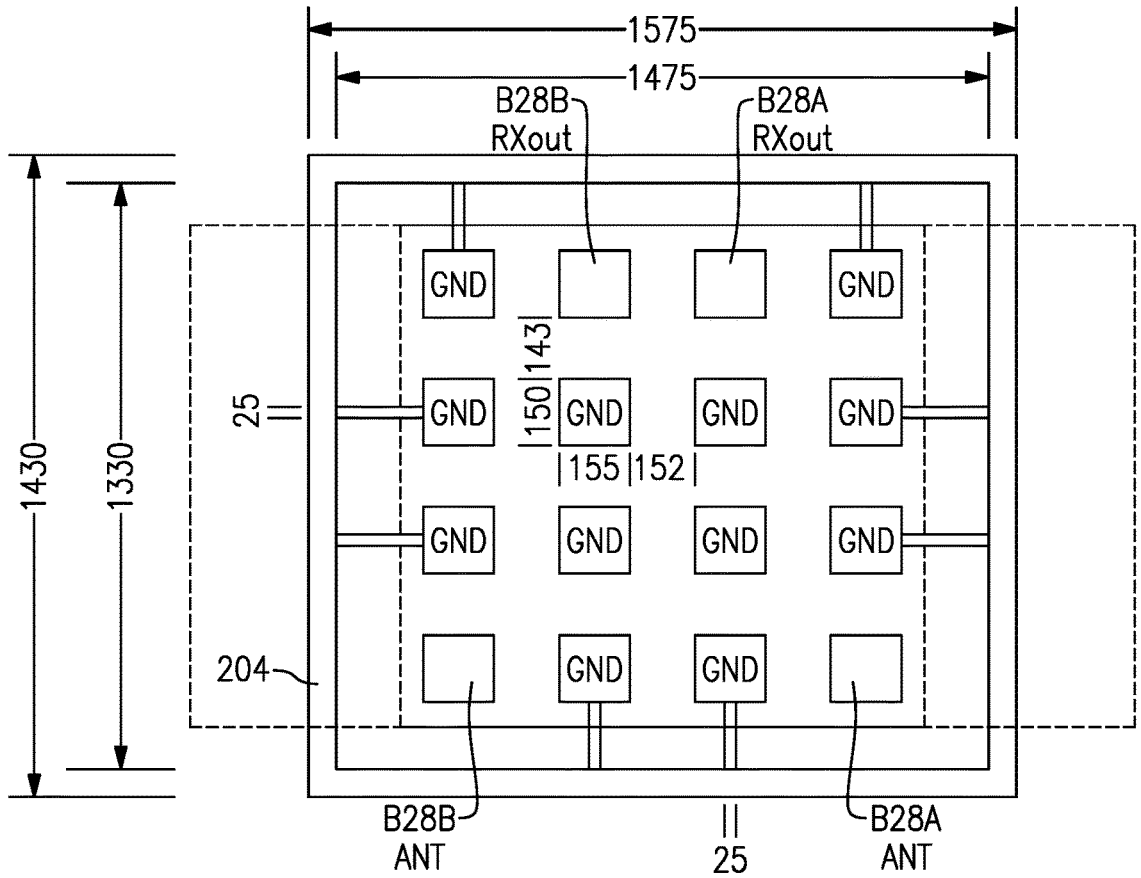
FIG. 13E shows an example layout design of a ground ring that can be implemented on a layer of the substrate of the RF filter device of FIGS. 11A-11F.

FIGS. 13D and 13E show example layout designs of the laser stopper layer (214 in FIG. 11A) and the ground ring (204 in FIG. 11A), both of which can be implemented on the second layer (L2). As shown, the outer dimensions of the laser stopper layer 214 can be selected to fit within the inner dimensions of the ground ring 204. With respect to the ground ring 204, one can see that the grounding contact pads (156b in FIG. 11A) can be electrically connected to the ground ring 204 directly on the second layer (L2), or through another layer. In FIGS. 13D and 13E, various example lateral dimensions are shown; however, it will be understood that such dimensions can be adjusted appropriately.

Figure 14:
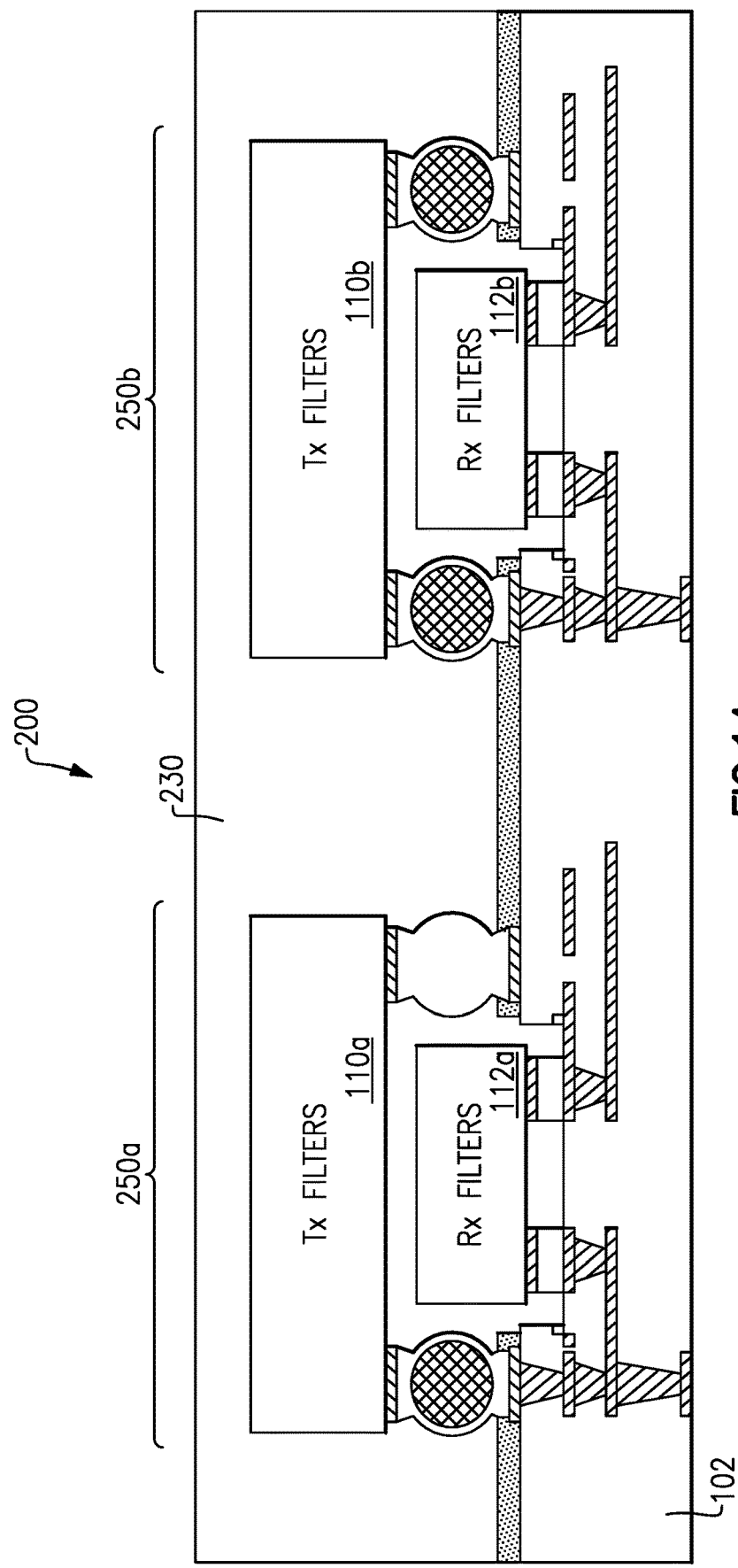
FIG. 14 shows that in some embodiments, an RF filter device having one or more features as described herein can include a plurality of nested assemblies.

In the various examples described herein, an RF filter device 200 is depicted as having a nested assembly of a Tx filter device and an Rx filter device. FIG. 14 shows that in some embodiments, an RF filter device 200 having one or more features as described herein can include a plurality of nested assemblies (e.g., 250a, 250b). In some embodiments, some or all of such nested assemblies can be configured so that Rx bands supported by the Rx filter device (112a and/or 112b) correspond to Tx bands supported by the Tx filter device (110a and/or 110b). In some embodiments, Rx bands supported by the Rx filter device of one nested assembly can correspond to Tx bands supported by the Tx filter device of the other nested assembly.

In the example of FIG. 14, the two nested assemblies 250a, 250b can have respective connections, such as signal connections and grounding connections, implemented on and/or within a packaging substrate 102. Further, the two nested assemblies 250a, 250b can be encapsulated by an overmold 230.

In some embodiments, an RF filter device 200 having one or more features as described herein can include a nested assembly of a Tx filter device and an Rx filter device, and one or more filter devices that are not arranged in a nested configuration.

Figure 15:
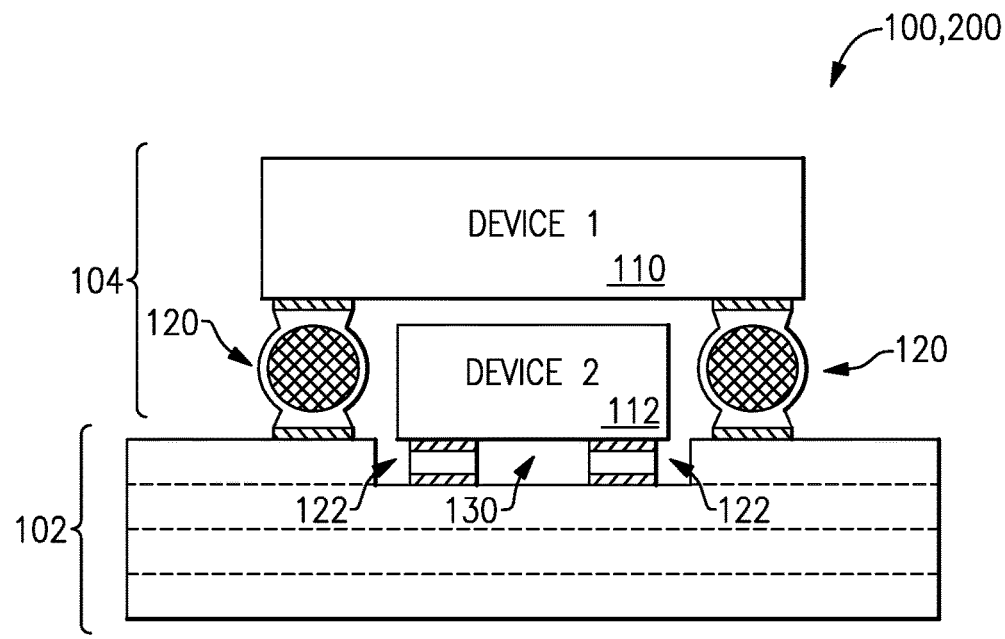
FIG. 15 shows that in some embodiments, an assembly of nested devices can be implemented on a substrate so as to result in an RF device such as an RF filter device.

FIGS. 15-18 show various examples of products in which one or more features of the present disclosure can be implemented. For example, FIG. 15 shows that in some embodiments, an assembly 104 of nested devices 110, 112 can be implemented on a substrate 102 so as to result in an RF device 100 such as an RF filter device 200. In some embodiments, such a device can be configured to be mounted on a circuit board such as a phone board.

Figure 16:
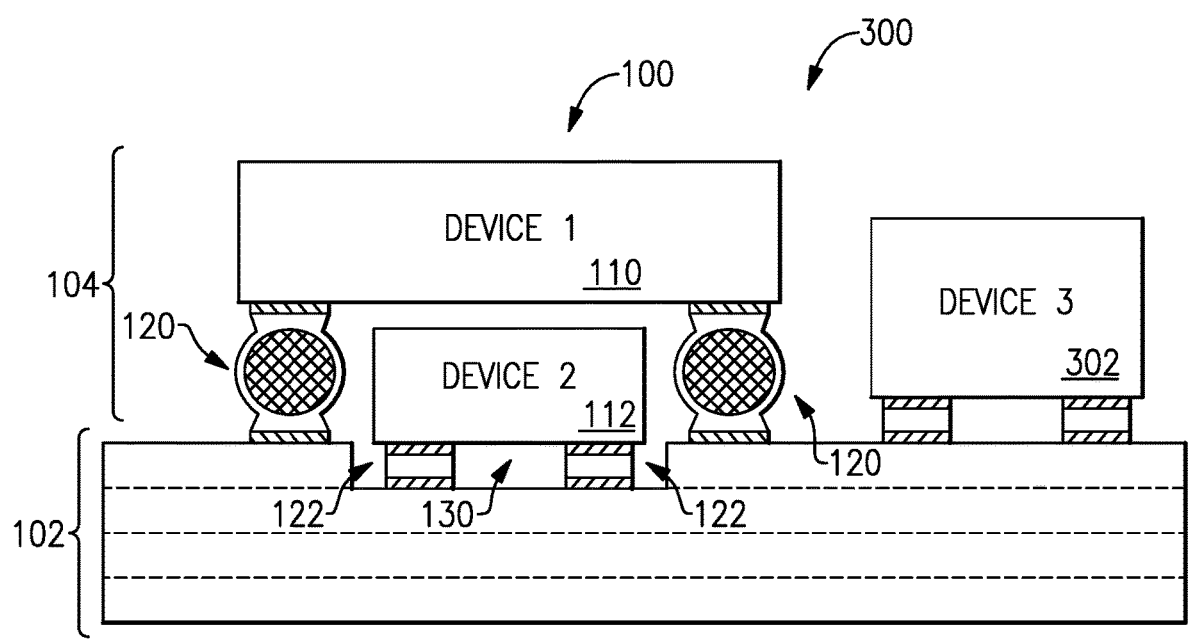
FIG. 16 shows that in some embodiments, an assembly of nested devices can be implemented on a substrate along with one or more filter and/or non-filter devices.

In another example, FIG. 16 shows that in some embodiments, an assembly 104 of nested devices 110, 112 can be implemented on a substrate 102. On such a substrate, one or more filter and/or non-filter devices (e.g., Device 3 302) can be mounted so as to result in a packaged device 300 that includes filtering functionality. In some embodiments, such a device can be configured to be mounted on a circuit board such as a phone board.

Figure 17:
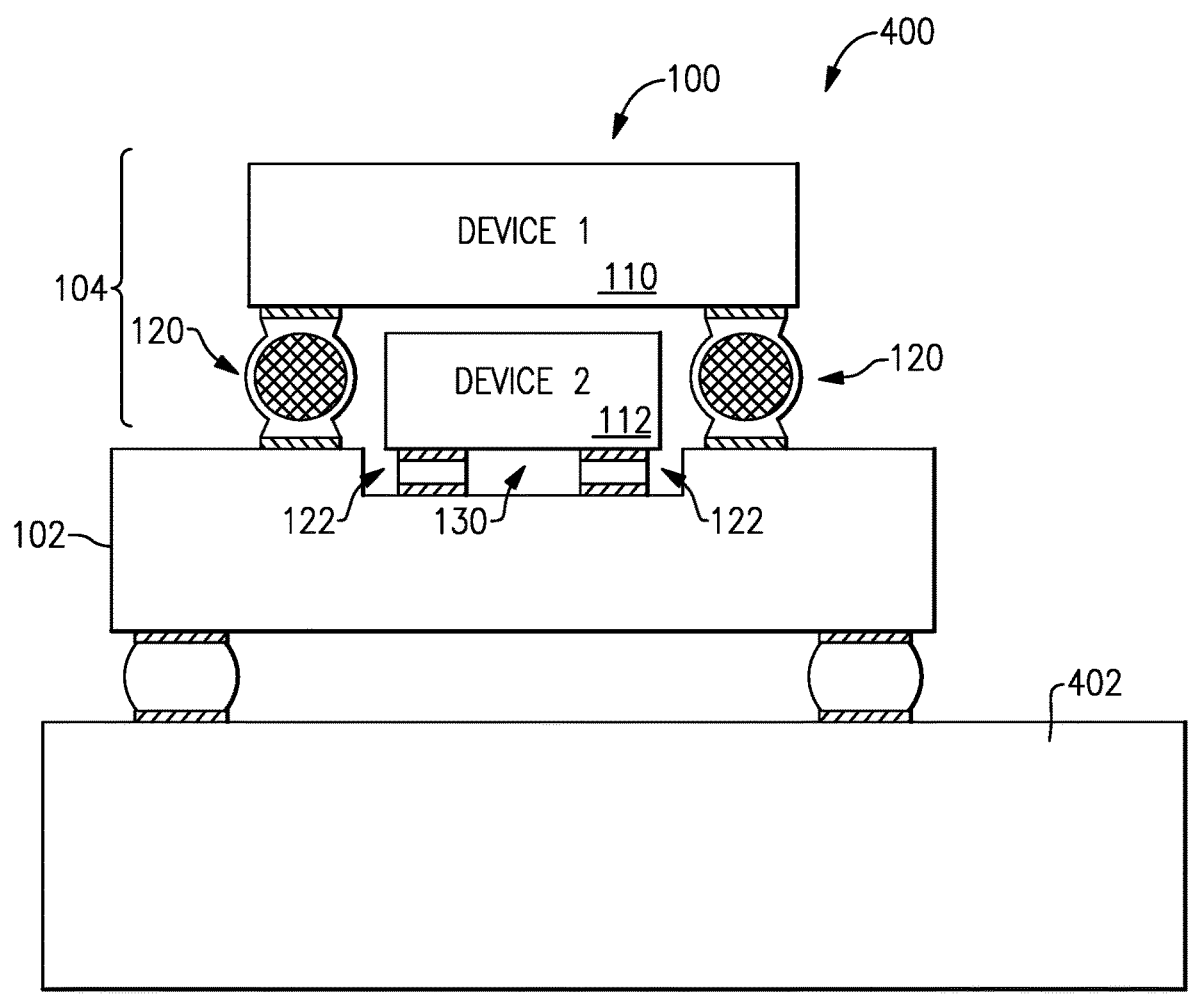
FIG. 17 shows that in some embodiments, an RF device having one or more features as described herein can be mounted on another substrate so as to result in a packaged module.

In yet another example, FIG. 17 shows that in some embodiments, an RF device 100 having one or more features as described herein (such as the RF device 100 of FIG. 15) can be mounted on another substrate 402 so as to result in a packaged module 400.

In the various examples of FIGS. 15-17, it will be understood that a mold structure can be implemented over the respective substrate, similar to the example of FIG. 11F. In the example of FIG. 17, the RF device 100 can include such a mold structure prior to mounting on the substrate 402. Alternatively, the RF device 100 can be without a mold structure when mounted on the substrate 402, and a common mold structure can be implemented to cover the assembly 104 of nested devices 110, 112, as well as other portions of the module over the substrate 402.

For the purpose of description, it will be understood that each device in the examples of FIGS. 15-17 can be considered to be a packaged device or module. Thus, in the example of FIG. 17, the packaged module or device 400 can include another packaged module or device 100.

In the examples of FIGS. 15-17, a nested configuration of devices such as filters is depicted to be implemented on a corresponding substrate such as a packaging substrate; and the resulting packaged device can be configured to be mountable on a circuit board such as a phone board. It will be understood that in some embodiments, a nested configuration of devices as described herein can be implemented directly on a circuit board (e.g., a phone board) and provide a desirable reduction in footprint size for an assembly of such devices.

In various examples described herein, a filter can be implemented in a die format. Such a die filter can include, for example, a surface acoustic wave (SAW) filter. It will be understood that a filter as described herein can also be implemented in other formats.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless modem configured to support machine type communications, a wireless access point, a wireless base station, etc. Although described in the context of wireless devices, it will be understood that one or more features of the present disclosure can also be implemented in other RF systems such as base stations.

Figure 18:
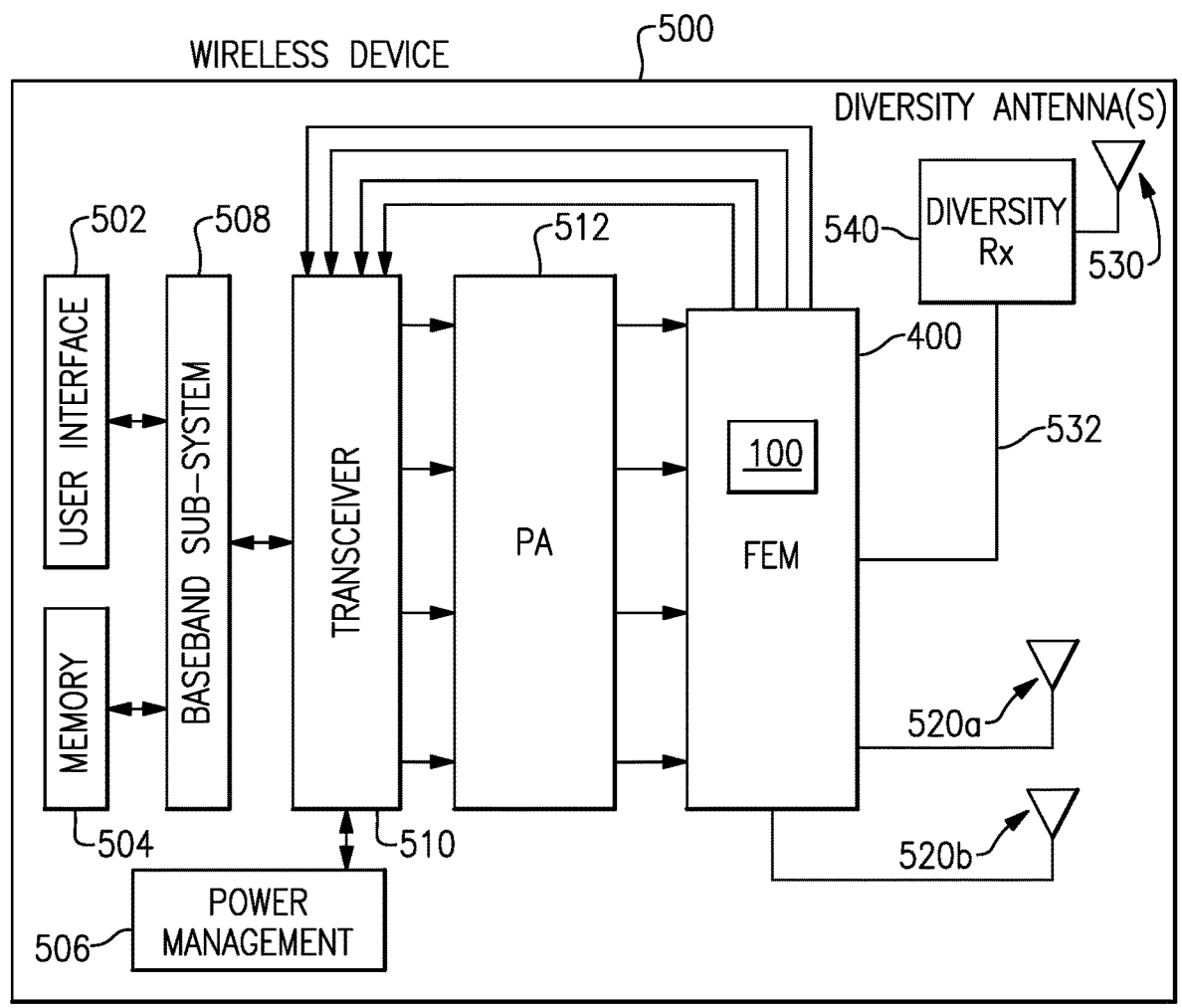
FIG. 18 depicts an example wireless device having one or more advantageous features described herein.

FIG. 18 depicts an example wireless device 500 having one or more advantageous features described herein. In some embodiments, an RF device 100 having one or more features as described herein can be implemented in or as part of a module such as a front-end module (FEM) 400 of the wireless device 500. It will be understood that an RF module 100 having one or more features as described herein can also be implemented in one or more other modules, directly on a circuit board of the wireless device 500, or any combination thereof.

In the example of FIG. 18, power amplifiers (PAs) are depicted in a PA module 512. Such power amplifiers can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 18, a diversity receive (DRx) module 540 can be implemented between one or more diversity antennas (e.g., diversity antenna 530) and the front-end module 100. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 540 can then be routed to the front-end module 100 through one or more signal paths.

In the example of FIG. 18, a plurality of antennas (e.g., 520*a*, 520*b*) can be configured to, for example, facilitate transmission of RF signals from the PA module 512. In some embodiments, receive operations can also be achieved through some or all of the antennas 520*a*, 520*b*.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. Claims and their equivalents are intended to cover such forms or modifications as would fall within the scope and spirit of the disclosure.

What is claimed is:

1. A wireless device comprising:
a transmitter circuit, and a receiver circuit;
one or more antennas configured to support transmit and receive operations; and
a radio-frequency module operationally coupled to the transmitter circuit, the receiver circuit and the one or more antennas, the radio-frequency module including a substrate having a plurality of layers with a first layer at an upper side of the substrate and a second layer underneath the first layer, the first layer including an upper surface, the second layer including an upper surface such that a cavity is defined by the first layer and a rectangular shaped floor provided by the upper surface of the second layer, the radio-frequency module further including a stopper layer implemented on the upper surface of the second layer to form a boundary around the cavity, and a first set of contact pads implemented on the upper surface of the first layer so as to be within a first rectangular region that overlaps with the rectangular floor of the cavity, the first set of contact pads including two input pins and two antenna pins each connected to an antenna of the one or more antennas when the antenna is in operation, the two input pins and two antenna pins positioned at respective corners of the first rectangular region, the radio-frequency module further including a second set of contact pads implemented on the rectangular shaped floor of the cavity, the second set of contact pads including two antenna pins and two output pins, each antenna pin connected to an antenna of the one or more antennas when the antenna is in operation, the two antenna pins and two output pins arranged so that the two antenna pins are positioned at respective corners of the rectangular shaped floor such that the two antenna pins of the second set of contact pads are adjacent to the two antenna pins of the first set of contact pads, the radio-frequency module further including first and second sets of support structures implemented over the first and second sets of contact pads, respectively, the radio-frequency module further including transmit and receive filter devices positioned over the first and second sets of support structures, respectively, such that the receive filter device is mounted on the substrate so as to be in a space defined by an underside of the transmit filter device and the first set of support structures, each of the first set of support structures dimensioned to provide sufficient height in the space to accommodate the receive filter device, and including a solder structure and a metal structure formed from a copper core or copper pillar, the metal structure configured to prevent collapse of the transmit filter device onto the receive filter device if the solder structure fails, the transmit filter device including two output pins each connected to the respective one of the two input pins of the first set of contact pads, the receive filter device including two input pins each connected to the respective one of the two output pins of the second set of contact pads.

2. The wireless device of claim 1 wherein each of the transmit filter device and the receive filter device is implemented as a surface acoustic wave device.

3. The wireless device of claim 1 wherein the transmit filter device is configured to support a plurality of respective frequency bands, and the receive filter device is configured to support a plurality of respective frequency bands.

4. The wireless device of claim 3 wherein the frequency bands associated with the transmit filter device are the same as the frequency bands associated with the receive filter device.

5. The wireless device of claim 1 wherein the radio-frequency module further includes a mold structure implemented over the substrate to substantially encapsulate the transmit and receive filter devices.

* * * * *